United States Patent
Azuma et al.

(10) Patent No.: US 11,422,240 B2
(45) Date of Patent: Aug. 23, 2022

(54) LIGHT DETECTOR COMPRISING A TIME INTERVAL ADJUSTING PERFORMANCE BY A DELAY SETTING MODULE

(71) Applicant: DENSO CORPORATION, Kariya (JP)

(72) Inventors: Kenta Azuma, Kariya (JP); Noriyuki Ozaki, Kariya (JP); Shinji Kashiwada, Kariya (JP); Teiyu Kimura, Kariya (JP); Isamu Takai, Nagakute (JP); Hiroyuki Matsubara, Nagakute (JP)

(73) Assignee: DENSO CORPORATION, Kariya (JP)

( * ) Notice: Subject to any disclaimer, the term of this patent is extended or adjusted under 35 U.S.C. 154(b) by 511 days.

(21) Appl. No.: 16/582,290

(22) Filed: Sep. 25, 2019

(65) Prior Publication Data
US 2020/0018831 A1    Jan. 16, 2020

Related U.S. Application Data

(63) Continuation of application No. PCT/JP2018/012426, filed on Mar. 27, 2018.

(30) Foreign Application Priority Data

Mar. 27, 2017 (JP) .............................. JP2017-061318

(51) Int. Cl.
*G01S 7/486* (2020.01)
*G01S 7/4863* (2020.01)
*H01L 31/107* (2006.01)
*G01S 17/74* (2006.01)

(52) U.S. Cl.
CPC .......... *G01S 7/4863* (2013.01); *H01L 31/107* (2013.01); *G01S 17/74* (2013.01)

(58) Field of Classification Search
CPC .......... G01S 17/04; G01S 17/06; G01S 17/08; G01S 17/10; G01S 17/42; G01S 7/486; G01S 7/483; G01S 7/487; G01S 7/489; H01L 31/107
USPC .............................................. 250/214 R, 221
See application file for complete search history.

(56) References Cited

U.S. PATENT DOCUMENTS 5,633,706 A * 5/1997 Cho ........................ G01S 17/14
356/5.1
2009/0236501 A1 9/2009 Takahashi et al.

FOREIGN PATENT DOCUMENTS

JP          5644294 B2    12/2014
WO      2018181978 A1    10/2018

* cited by examiner

*Primary Examiner* — Que Tan Le
(74) *Attorney, Agent, or Firm* — Maschoff Brennan

(57) ABSTRACT

A light detector is provided to include a light receiving array having a plurality of light receivers respectively outputting pulse signals upon incidence of photons. A delay setting value is set which is used to adjust a time interval from when the pulse signals are output from the light receiving array to when a response number, which is a specified number of the light receivers outputting the pulse signals, is acquired.

21 Claims, 14 Drawing Sheets

LIGHT DETECTOR COMPRISING A TIME INTERVAL ADJUSTING PERFORMANCE BY A DELAY SETTING MODULE

CROSS REFERENCE TO RELATED APPLICATIONS

The present application is a continuation application of International Patent Application No. PCT/JP2018/012426 filed on Mar. 27, 2018, which designated the U.S. and claims the benefit of priority from Japanese Patent Application No. 2017-061318 filed on Mar. 27, 2017. The entire disclosures of all of the above applications are incorporated herein by reference.

TECHNICAL FIELD

The present disclosure relates to a light detector that utilizes an avalanche effect.

BACKGROUND

There is a light detector that uses an SPAD array in which a plurality of SPADs are arrayed, counts the number of pulse signals output from each SPAD onto which photons are incident, and thereby detects a light reception intensity. Here, SPAD, which is an abbreviation of Single Photon Avalanche Diode, is an avalanche photodiode that operates in Geiger mode and can detect the incidence of a single photon.

SUMMARY

According to an embodiment of the present disclosure, a light detector is provided to include a light receiving array having a plurality of light receivers respectively outputting pulse signals upon incidence of photons. A delay setting value is set which is used to adjust a time interval from when the pulse signals are output from the light receiving array to when a response number, which is a specified number of the light receivers outputting the pulse signals, is acquired.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Hereinafter, embodiments of the present disclosure will be described with reference to the drawings.

1. First Embodiment

[1-1. Configuration]

Figure 1:
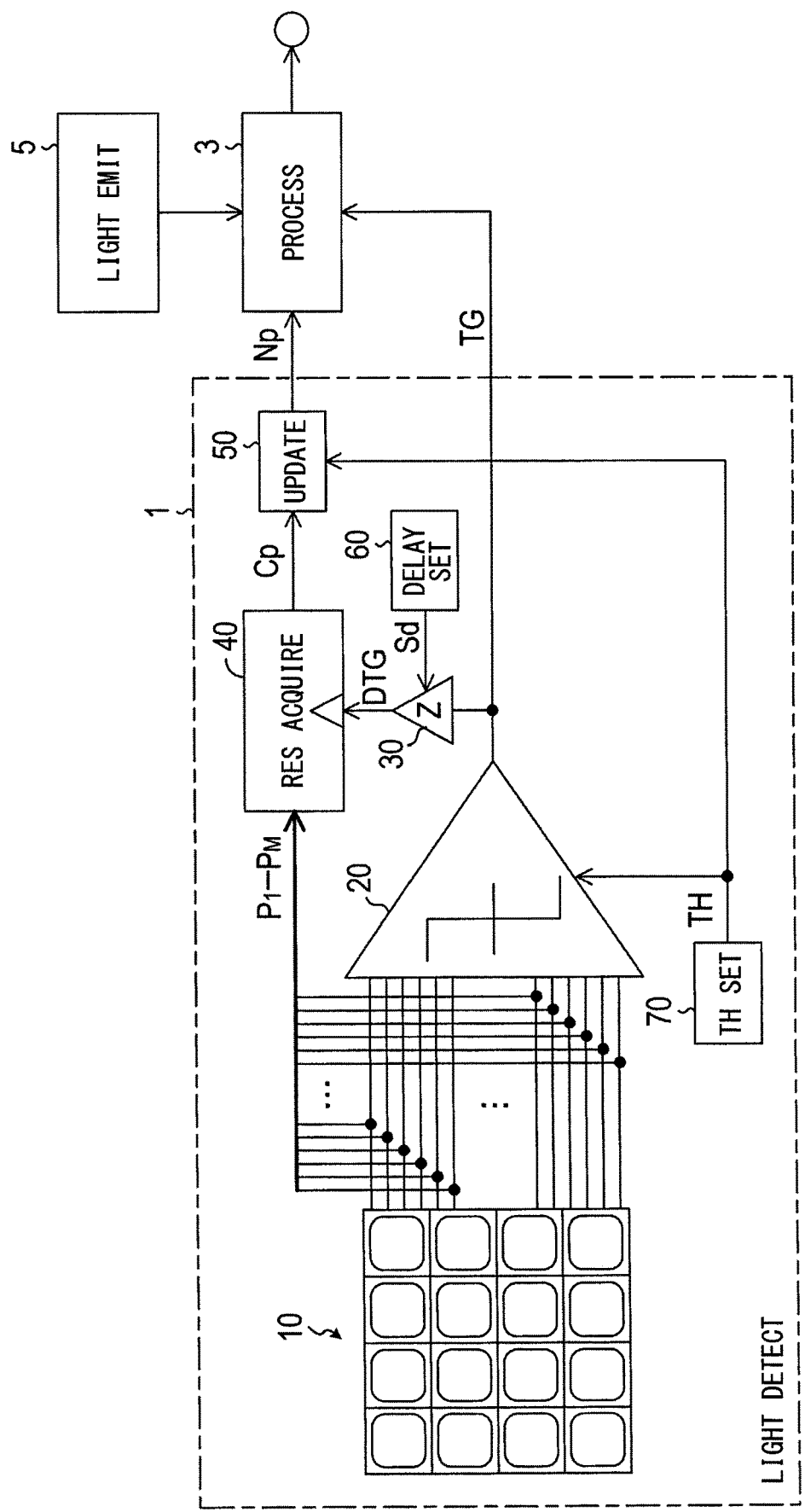
FIG. 1 is a block diagram showing a configuration of a light reception processing apparatus according to a first embodiment.

A laser radar apparatus as a light reception processing apparatus includes a light detector 1, a processor 3, and a light emitter 5, as shown in FIG. 1. The light emitter 5 transmits the light signal and notifies the processor 3 of the light emission time. The light detector 1 receives the reflected light of the light signal, and outputs a trigger signal TG indicating the light reception time and intensity information Np indicating the light reception intensity to the processor 3. The processor 3 calculates a calculation result based on the light emission time, the light reception time, and the intensity information Np, and then outputs the calculation result as object information. The calculation result is at least one of (i) a distance to an object that reflects a light signal and (ii) a luminance of the light signal (i.e., (i) a distance to an object alone, or (ii) a luminance of the light signal alone, or (iii) both the distance to the object and the luminance of the light signal).

Here, the processor 3 may be configured by using or including (i) a central processing unit (CPU) along with memory storing instruction executed by the CPU, or (ii) circuitry (i.e., hardware circuits including a digital and/or analog circuit) or (iii) both the CPU along with memory and the circuitry.

Note that, in the present disclosure, "information" may be not only uncountable but also countable. An information may be equivalent to an informational item or a data-item; thus, a plurality of informations may be equivalent to a plurality of informational items or a plurality of data-items.

The light detector 1 includes a light receiving array 10, a comparison module 20, a delay module 30, a response acquisition module 40, an update module 50, a delay setting module 60, and a threshold value setting module 70. The light receiving array 10 includes M light receivers 11. M is an integer of 2 or more. Each of the light receivers 11 may be configured in the same manner, or may be configured so as to intentionally differ in internal parameters so that the respective characteristics are different. For instance, "module", which may also be referred to as a circuit, may be configured to include circuitry (hardware circuit) as also described later in each description of the "module". However, there is no need to be limited thereto. That is, "module" may be also configured to include a central processing unit (CPU) along with memory storing instructions executed by the CPU, or both of the circuitry and the CPU along with memory.

Figure 2:
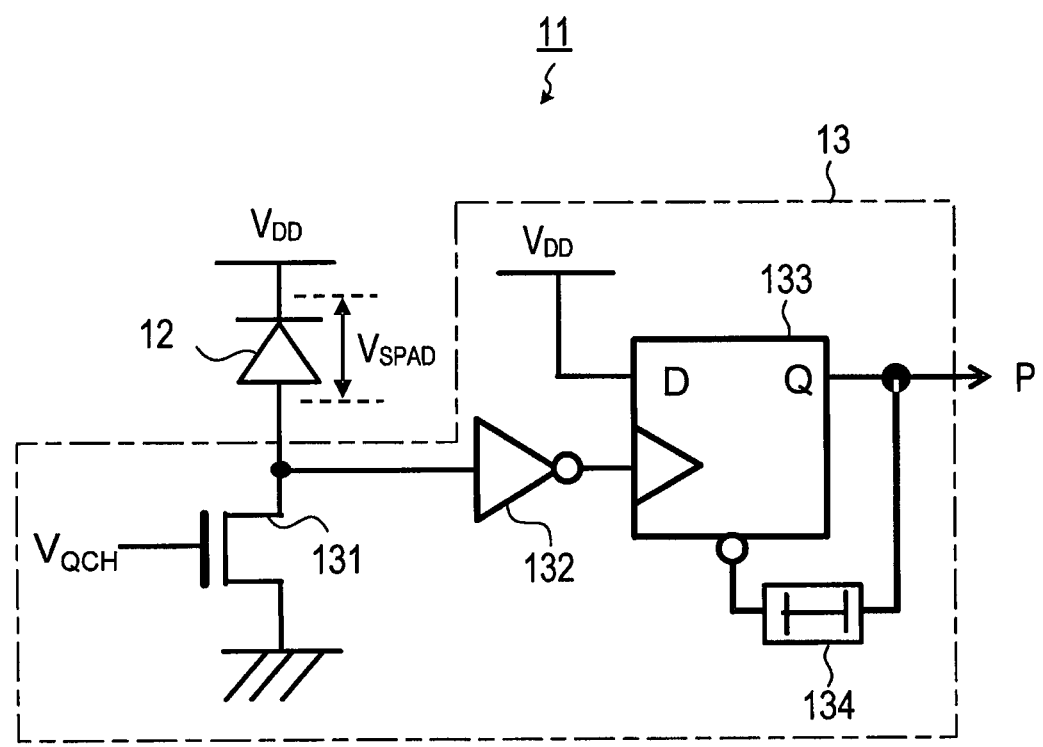
FIG. 2 is a circuit diagram showing a configuration of an SPAD.

The light receiver 11 includes an SPAD 12 and a light reception circuit 13 as shown in FIG. 2. The M SPADs 12 belonging to the M light receivers 11 are two-dimensionally arrayed. The SPAD 12 is a light receiving element that forms a light receiving surface for receiving a light signal. When photons are incident on the SPAD 12, the light receiver 11 outputs a pulse signal P having a preset pulse width. Hereinafter, respective pulse signals output from the M light receivers 11 are represented by $P_1$ to $P_M$.

The SPAD 12, which is an abbreviation for Single Photon Avalanche Diode, is an avalanche photodiode that operates in Geiger mode and can detect the incidence of a single photon. The light reception circuit 13 includes a transistor 131, an inverting circuit 132, a D flip flop (hereinafter, DFF) circuit 133, and a delay circuit 134.

In the SPAD 12, its cathode receives a voltage, and its anode is grounded via a transistor 131. That is, in a state where the transistor 131 is turned on, the reverse voltage VsPAD higher than the breakdown voltage is applied to the SPAD 12; the SPAD 12 is connected so as to operate in Geiger mode. The inverting circuit 132 is connected to the anode of the SPAD 12. When no avalanche current flows in the SPAD 12, the input of the inverting circuit 132 is at low level. When the avalanche current flows, the input of the inverting circuit 132 is changed to the high level due to the on resistance of the transistor 131. The DFF circuit 133 changes its output to the high level at the falling edge where the output of the inverting circuit 132 changes from the high level to the low level. The output of the DFF circuit 133 is connected to the reset terminal of the DFF circuit 133 via the delay circuit 134. The delay circuit 134 inverts the signal level of an output of the DFF circuit 133 and delays the output by a preset delay time T (i.e., time interval) and inputs the delayed output to the reset terminal. As a result, when the delay time T elapses after the output of the DFF circuit 133 changes to the high level, the DFF circuit 133 is reset to change to the low level. That is, each time photons enter the SPAD 12, the light reception circuit 13 outputs a pulse signal P having a pulse width of τ. The pulse width τ is set to such a length that individual photons can be detected when photons are continuously input to the same SPAD 12.

Figure 3:
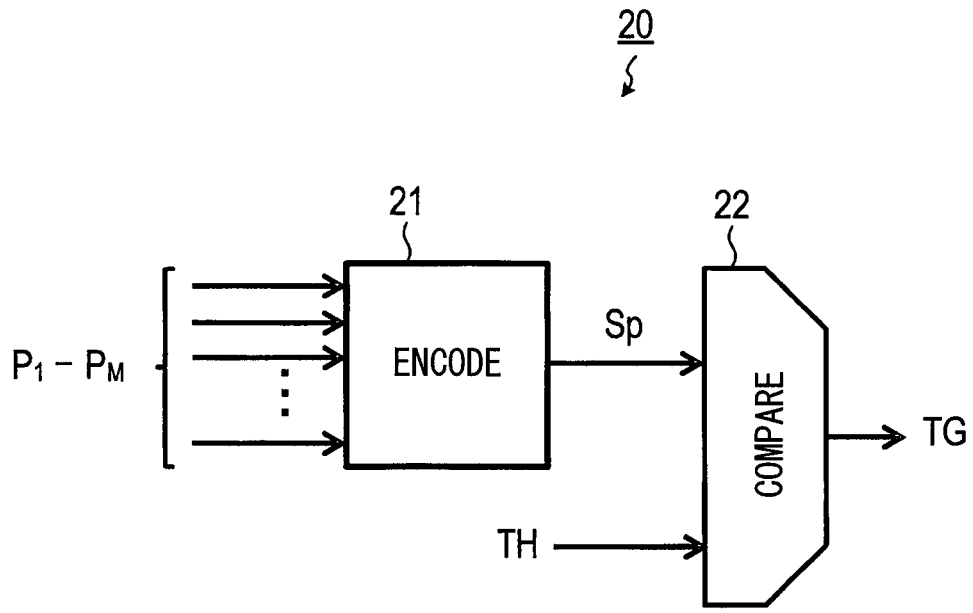
FIG. 3 is a circuit diagram showing a configuration of a comparison module.

The comparison module 20 includes an encoder 21 and a comparator 22 as shown in FIG. 3. The encoder 21 encodes the number of outputs at the high level out of all the outputs of the M light receivers 11 included in the light receiving array 10 into a binary number and outputs the binary number. This output is called a response number Sp (which is also referred to as the number of responses Sp or a response count). The response number Sp is the number of pulse signals $P_1$ to $P_M$ simultaneously output from the M light receivers 11 included in the light receiving array 10, that is, the number of the light receivers 11 simultaneously outputting the pulse signals in response to the respective light signals. The response number Sp increases or decreases with the passage of time according to the generation and disappearance of the pulse signals. The comparator 22 compares the response number Sp output by the encoder 21 with a trigger threshold value TH set by the threshold value setting module 70. At the time when the response number Sp reaches the trigger threshold value TH, the comparator 22 outputs a trigger signal TG representing the reception time of the light signal.

Figure 4:
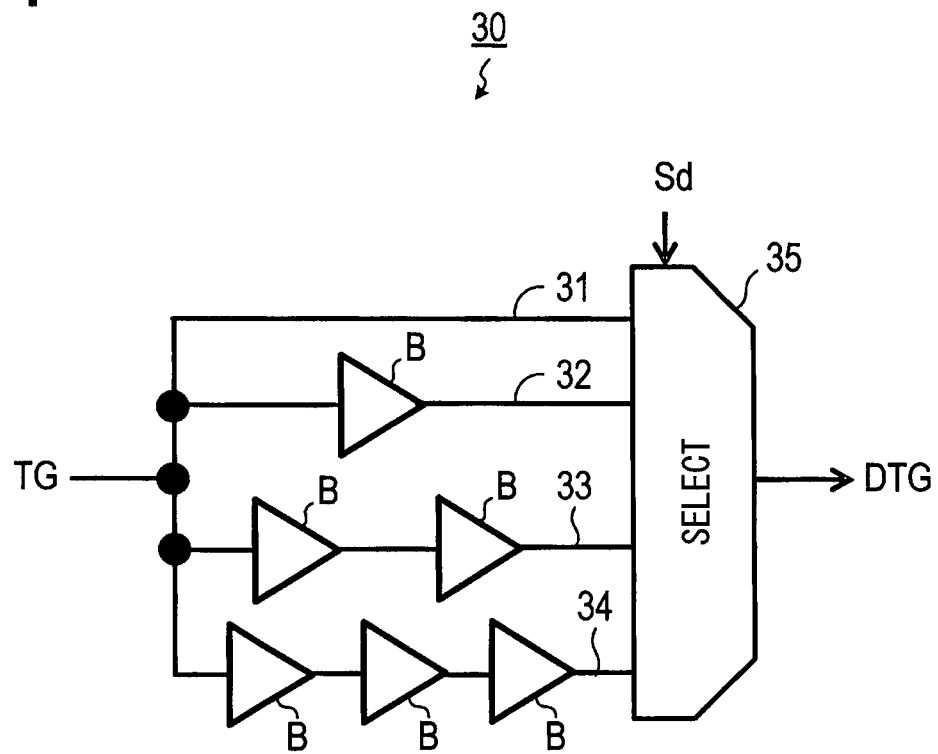
FIG. 4 is a circuit diagram showing a configuration of a delay module.

The delay module 30, as shown in FIG. 4, includes a plurality of delay lines 31 to 34, and a selector 35. The plurality of delay lines 31 to 34 are configured to differ in signal delay time by differentiating the number of buffer circuits B connected in series from each other. The selector 35 selects one of the delay lines 31 to 34 in accordance with the delay setting value Sd output from the delay setting module 60, and outputs, as a delayed trigger signal DTG, the trigger signal TG transmitted through the selected delay line. Although the number of delay lines is four in FIG. 4, the number of delay lines is not limited to four and may be several (two or more).

Figure 5:
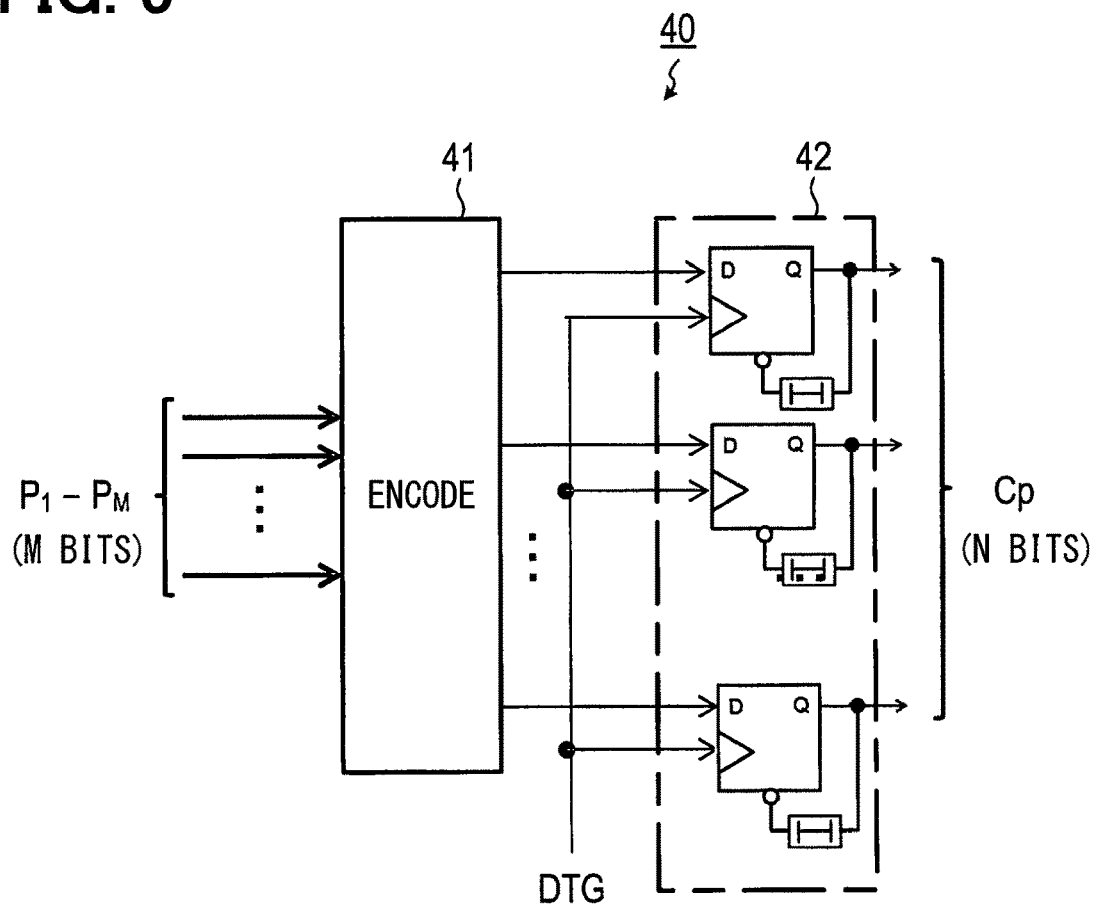
FIG. 5 is a circuit diagram showing a configuration of a response acquisition module.

The response acquisition module 40, which may also be referred to as an intensity output module, includes an encoder 41 and a latch circuit group 42 as shown in FIG. 5. The encoder 41 outputs the response number Sp as the encoder 21 does. In the encoder 41, the response number Sp is represented by N bits. Here, $M=2^N$ (i.e., 2^N), and N is a positive integer. The latch circuit group 42 includes N DFF circuits. The latch circuit group 42 latches the N-bit outputs of the encoder 41 at the time of the rising edge of the delayed trigger signal DTG, and outputs the latched value as a count value Cp. Each of the N circuits included in the latch circuit group 42 has the same configuration as the DFF circuit 133 and delay circuit 134 described above, and holds a count value Cp for a preset holding time. The holding time is set to be longer than the minimum necessary length for the update module 50 to execute the process for the count value Cp.

Figure 6:
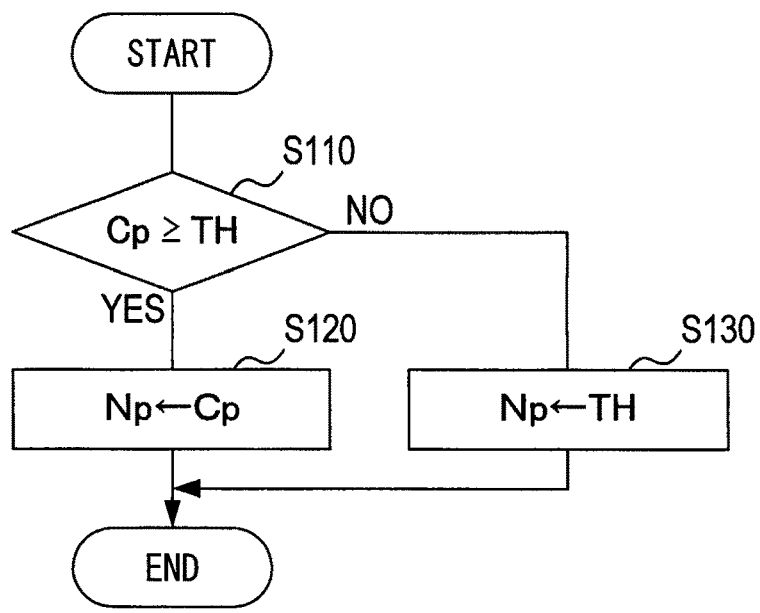
FIG. 6 is a flowchart showing an operation of the update module.

The update module 50 generates intensity information Np from the count value Cp. The contents of the process will be described along the flowchart shown in FIG. 6. The update module 50 can be realized by, for example, a logic circuit.

The update module 50 starts the operation when the count value Cp is output from the response acquisition module 40. Then, in S110, the update module 50 determines whether the count value Cp is equal to or greater than the trigger threshold value TH. When Cp≥TH, the update module 50 determines that it is normal; then, the process proceeds to S120. When Cp<TH, it is determined that there is a delay adjustment error (that is, a setting error in the delay setting module 60); then the process proceeds to S130. In S120, the update module 50 outputs the count value Cp as it is as the intensity information Np; then, the present process is ended. In S130, the update module 50 outputs the trigger threshold value TH as the intensity information Np; then, the present process is ended.

The delay setting module 60 has a mechanical switch capable of setting the delay setting value Sd or a register capable of electrically writing the delay setting value Sd. The threshold value setting module 70 has a mechanical switch capable of setting the trigger threshold value TH or a register capable of electrically writing the trigger threshold value TH.

[1-2. Setting of Delay Setting Value Sd/Trigger Threshold Value TH]

Here, the characteristics of the light detector 1 related to the setting of the delay setting value Sd and the trigger threshold value TH will be described with reference to FIGS. 15 and 16.

Figure 15:
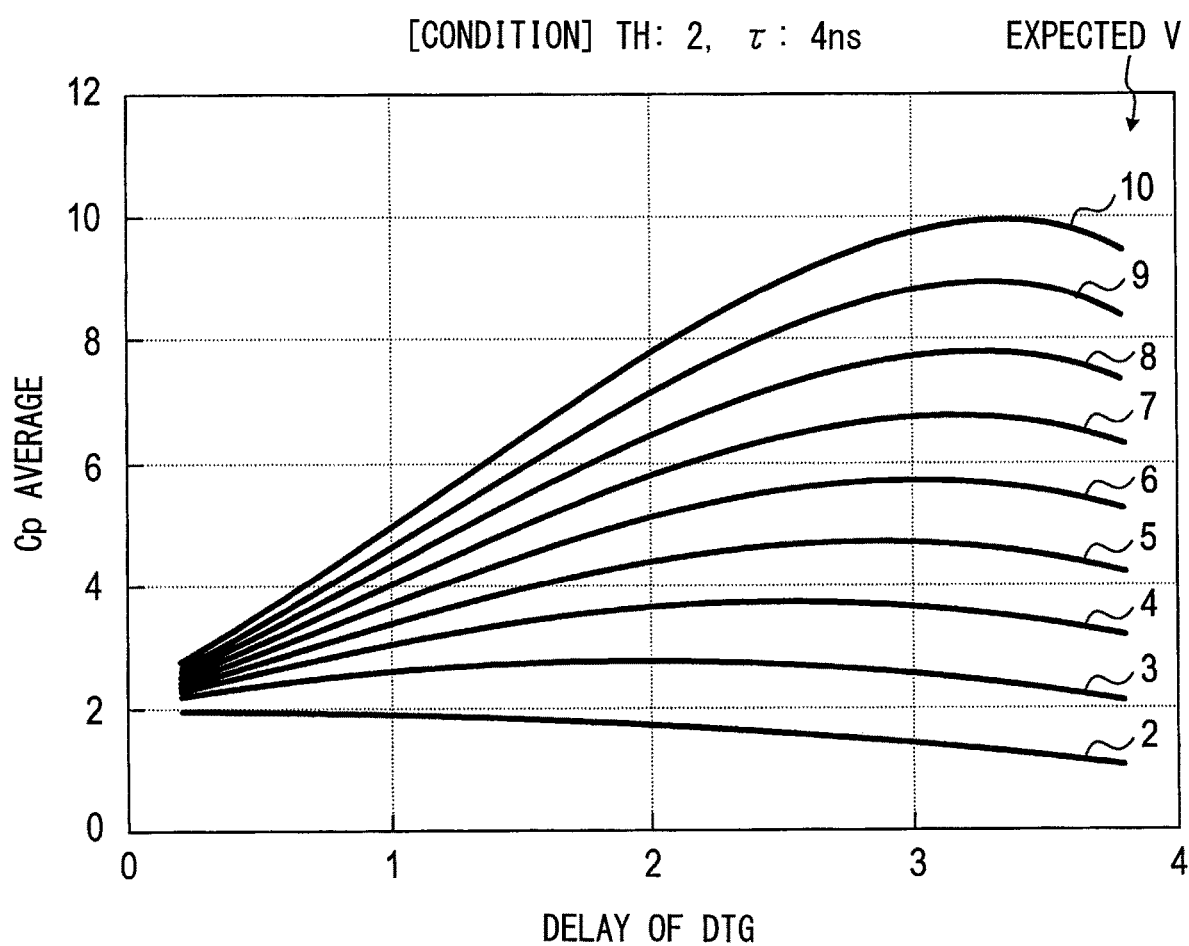
FIG. 15 is a graph showing the relationship between a delay time and an expected value of a count value when a trigger threshold value is TH=2.
Figure 16:
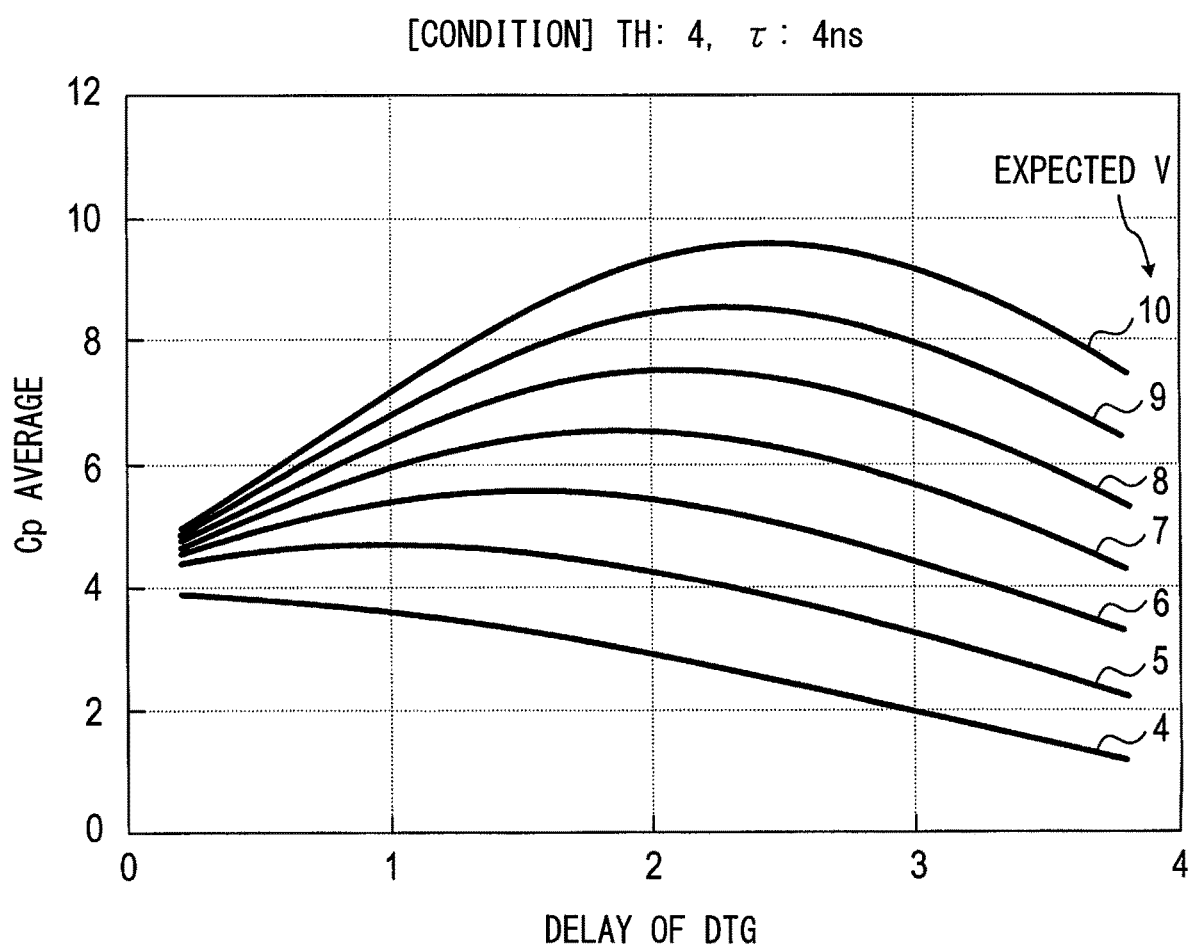
FIG. 16 is a graph showing the relationship between a delay time and an expected count value when a trigger threshold value is TH=4.

FIGS. 15 and 16 show the relationship between (i) the delay amount added to the delayed trigger signal DTG and (ii) the average value of the count value Op; the relationship is obtained by simulation by changing the intensity of the light signal radiated to the light receiving array 10. Note that, (i) the pulse width of the pulse signal P is 4 ns, and (ii) the intensity of the light signal to be radiated is provided to permit the expected value of the count value Cp to be 2 to 10. FIG. 15 shows the case where the trigger threshold value TH is set to 2; FIG. 16 shows the case where the trigger threshold value TH is set to 4.

In consideration of (i) the setting value of the trigger threshold value TH and (ii) the average intensity of the light signal incident on the light receiving array 10, the delay setting value Sd is selected such that the delay amount maximizes the average value of the count value Cp on the characteristic graphs shown in FIGS. 15 and 16.

For example, when TH is set to 2 and the intensity of the light signal has a magnitude corresponding to 10 as the expected value of the count value, the delay setting value Sd is set so that the delay amount is about 3.3 ns. As can be seen from both FIGS. 15 and 16, if the intensity of the light signal is constant, the time to the peak of the graph becomes shorter as the trigger threshold value TH increases. That is, the delay setting value Sd may be set such that the delay amount decreases as the trigger threshold value TH increases. Also, if the trigger threshold value TH is constant, the time to peak of the graph becomes shorter as the intensity of the light signal decreases. That is, the delay setting value Sd may be set so that the delay amount decreases as the intensity of the light signal decreases.

[1-3. Effects]

According to the first embodiment detailed above, the following effects may be obtained.

(1a) The light detector 1 includes the delay setting module 60, and is configured to be able to set the delay amount of the delayed trigger signal DTG as appropriate. Therefore, according to the light detector 1, the response number in the light receiving array 10 can be acquired at an accurate time, and the measurement accuracy can be improved.

(1b) The light detector 1 includes the update module 50; when the count value Cp is smaller than the trigger threshold value TH, the trigger threshold value TH is used as the intensity information Np instead of the count value Cp. Therefore, according to the light detector 1, it is possible to suppress a measurement error caused by an adjustment error of (i) the delay amount in the delay setting module 60 or (ii) the trigger threshold value TH.

The phenomenon of Cp<TH occurs, for example, in the following case. Suppose a case where the trigger threshold value TH is set to the same level as the expected value of the count value Cp corresponding to the intensity of the light signal. In such a case, As shown in the graph where the expected value is 2 in FIG. 15 and in the graph where the expected value is 4 in FIG. 16, as the delay amount of the delayed trigger signal DTG becomes larger, the count value Cp becomes smaller than the trigger threshold value TH.

2. Second Embodiment

[2-1. Main Difference from First Embodiment]

Since the basic configuration of a second embodiment is similar to the first embodiment, the main difference will be described below. Note that the same reference signs as those in the first embodiment indicate the same configuration, and refer to the preceding descriptions.

In the first embodiment described above, the delay setting module 60 manually sets the delay setting value Sd. In contrast, the second embodiment is different from the first embodiment in that the delay setting value Sd is automatically set.

Figure 7:
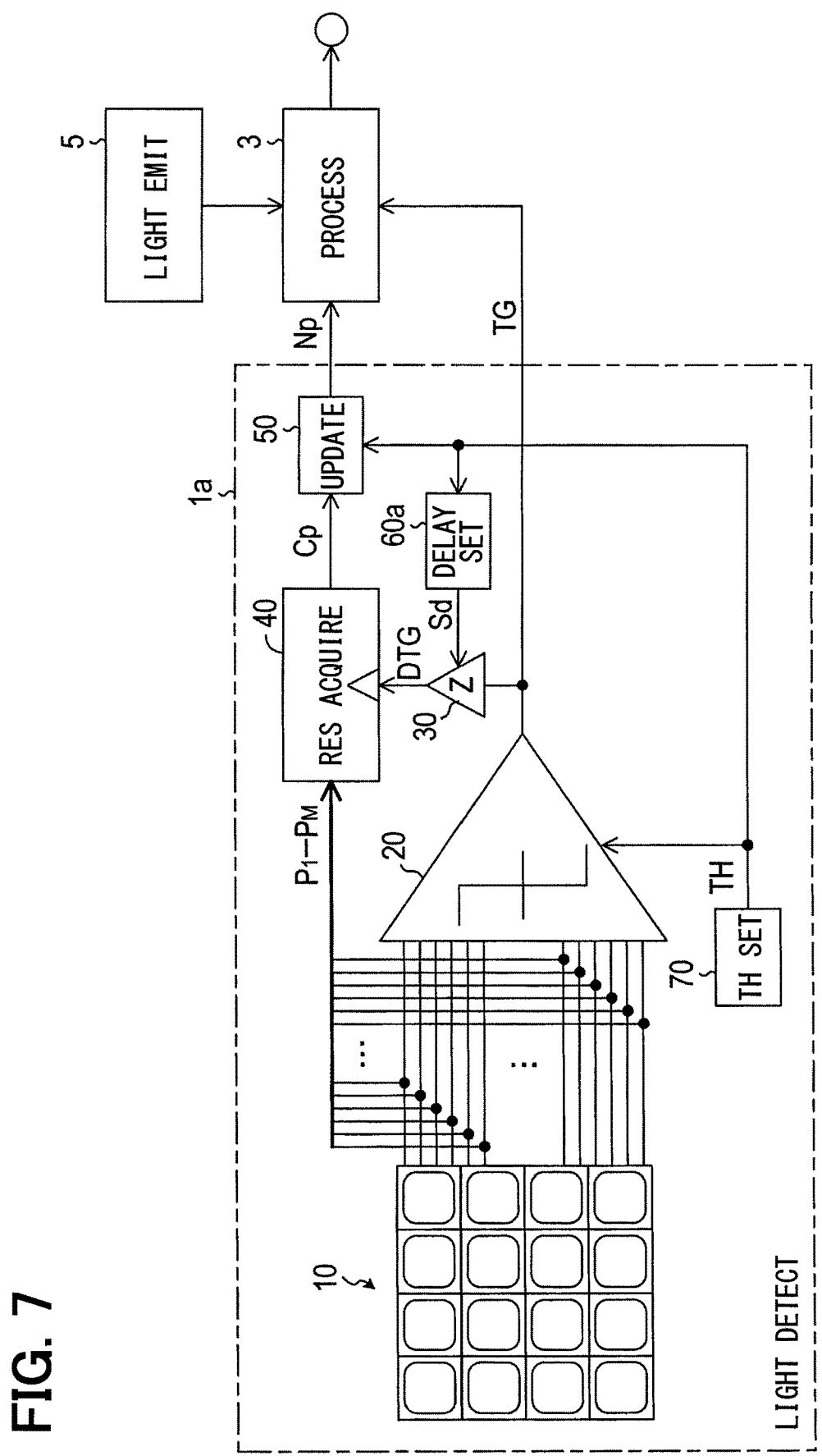
FIG. 7 is a block diagram showing a configuration of a light reception processing apparatus according to a second embodiment.

As shown in FIG. 7, in the light detector 1a of the present embodiment, the delay setting module 60a acquires the trigger threshold value TH set by the threshold value setting module 70, and sets variably the delay setting value Sd according to the acquired trigger threshold value TH. Specifically, the present embodiment uses a table representing the correspondence between the trigger threshold value TH and the delay setting value Sd (i.e., the delay amount of the delayed trigger signal DTG) created based on the graphs of FIGS. 15 and 16. Each of the graphs may be stored in a storage. The table is set such that the delay amount decreases as the trigger threshold value TH increases. Then, when the trigger threshold value TH is set by the threshold value setting module 70, the delay setting module 60a automatically generates the delay setting value Sd suitable for the trigger threshold value TH, using the above table. The amount of delay in the delay module 30 is determined according to the generated delay setting value Sd.

[2-2. Effects]

According to the second embodiment described above, the effect (1a) of the first embodiment described above is exhibited, and further, the following effect is exhibited.

(2a) According to the light detector 1a, the amount of delay of the delayed trigger signal DTG suitable for the trigger threshold value TH is automatically set, so that the adjustment process can be simplified.

3. Third Embodiment

[3-1. Main Difference from First Embodiment]

Since the basic configuration of a third embodiment is similar to the first embodiment, the main difference will be described below. Note that the same reference signs as those in the first embodiment indicate the same configuration, and refer to the preceding descriptions.

In the first embodiment described above, the delay setting module 60 manually sets the delay setting value Sd. In contrast, the third embodiment is different from the first embodiment in that the delay setting value Sd is automatically set as in the second embodiment. Further, in the third embodiment, the information used when generating the delay setting value Sd is different from that in the second embodiment.

Figure 8:
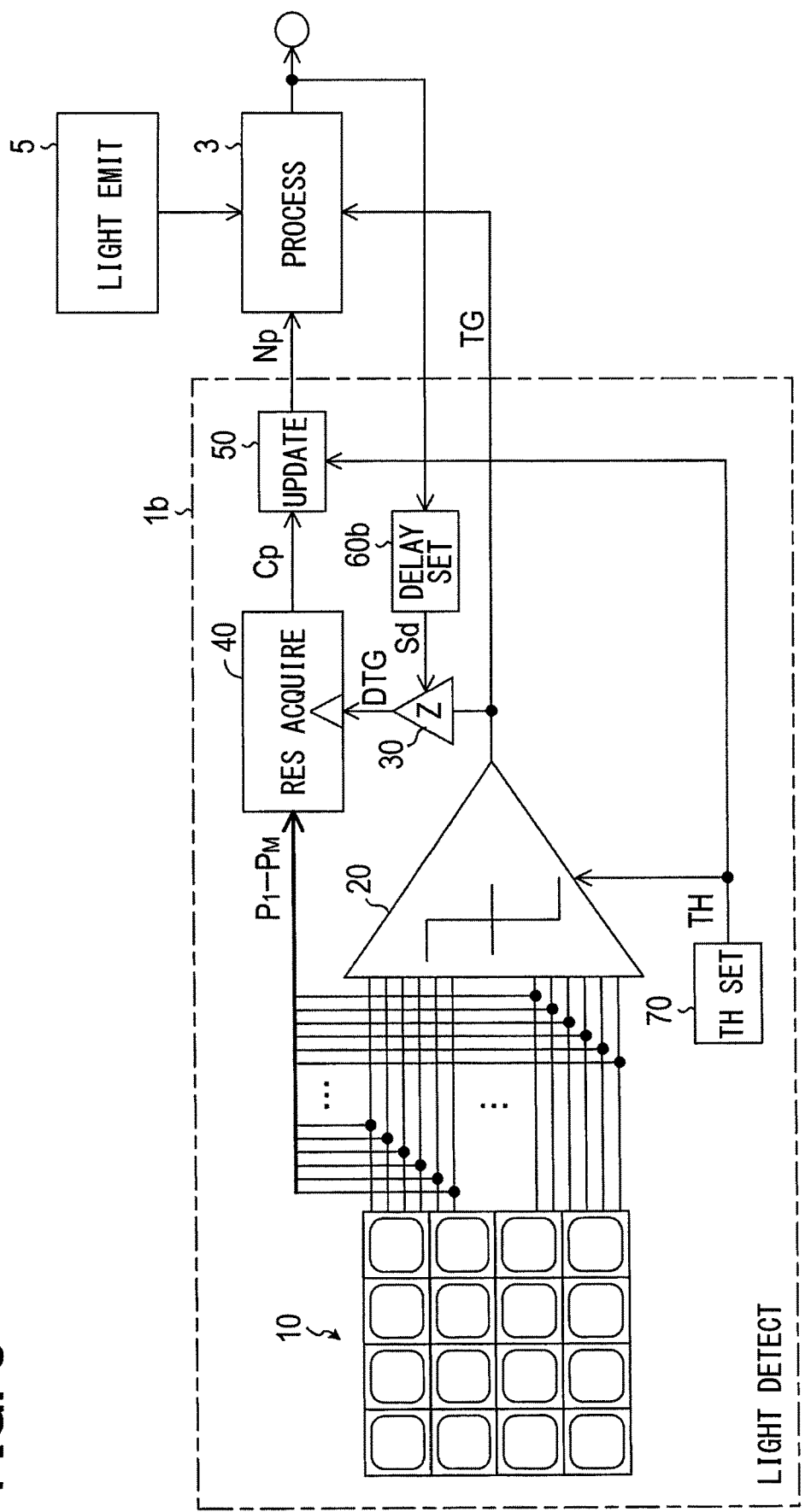
FIG. 8 is a block diagram showing a configuration of a light reception processing apparatus according to a third embodiment.

As shown in FIG. 8, in the light detector 1b of the present embodiment, the delay setting module 60b acquires object information from the processor 3, and variably sets the delay setting value Sd in accordance with the acquired object information. The object information to be acquired may be generated, for example, in the past measurement cycle, or may be generated immediately before this measurement. Further, the delay setting value Sd is specifically set using a table representing the correspondence between the object information and the delay setting value Sd, which is created based on the graphs of FIGS. 15 and 16, which may be stored in a storage. The object information may be at least one of (i) the distance to the object and (ii) the light reception intensity (i.e., (i) the distance to the object alone, or (ii) the light reception intensity alone, or (iii) both the distance to the object and the light reception intensity). The table is set such that the amount of delay increases as the light reception intensity increases or as the distance to the object decreases. The distance to the object and the light reception intensity are approximately linked, and the light reception intensity tends to be stronger as the distance to the object is closer. That is, both the distance to the object and the light receiving intensity can be used as intensity interlocking information. Then, when the object information is generated by the processor 3, the delay setting module 60b automatically generates the delay setting value Sd suitable for the object information (that is, the intensity interlocking information) using the above table. The amount of delay in the delay module 30 is determined according to the generated delay setting value Sd.

Here, although the delay setting module 60b generates the delay setting value Sd based on the object information, the delay setting module 60b may be configured to generate the delay setting value Sd considering both the object information and the trigger threshold value TH.

[3-2. Effects]

According to the third embodiment described above, the effect (1a) of the first embodiment described above is exhibited, and further, the following effect is exhibited.

(3a) According to the light detector 1b, even if the light reception intensity at the light receiving array 10 changes every moment, the delay amount of the delayed trigger signal DTG is appropriately set so as to follow the light reception intensity changing every moment.

4. Fourth Embodiment

[4-1. Main Difference from First Embodiment]

Since the basic configuration of a fourth embodiment is similar to the first embodiment, the main difference will be described below. Note that the same reference signs as those in the first embodiment indicate the same configuration, and refer to the preceding descriptions.

In the first embodiment described above, the delay setting module 60 manually sets the delay setting Sd. In contrast, a fourth embodiment is different from the first embodiment in that the delay setting value Sd is automatically set as in the second and third embodiments. Further, in the fourth embodiment, the information used when generating the delay setting value Sd is different from the second and third embodiments.

Figure 9:
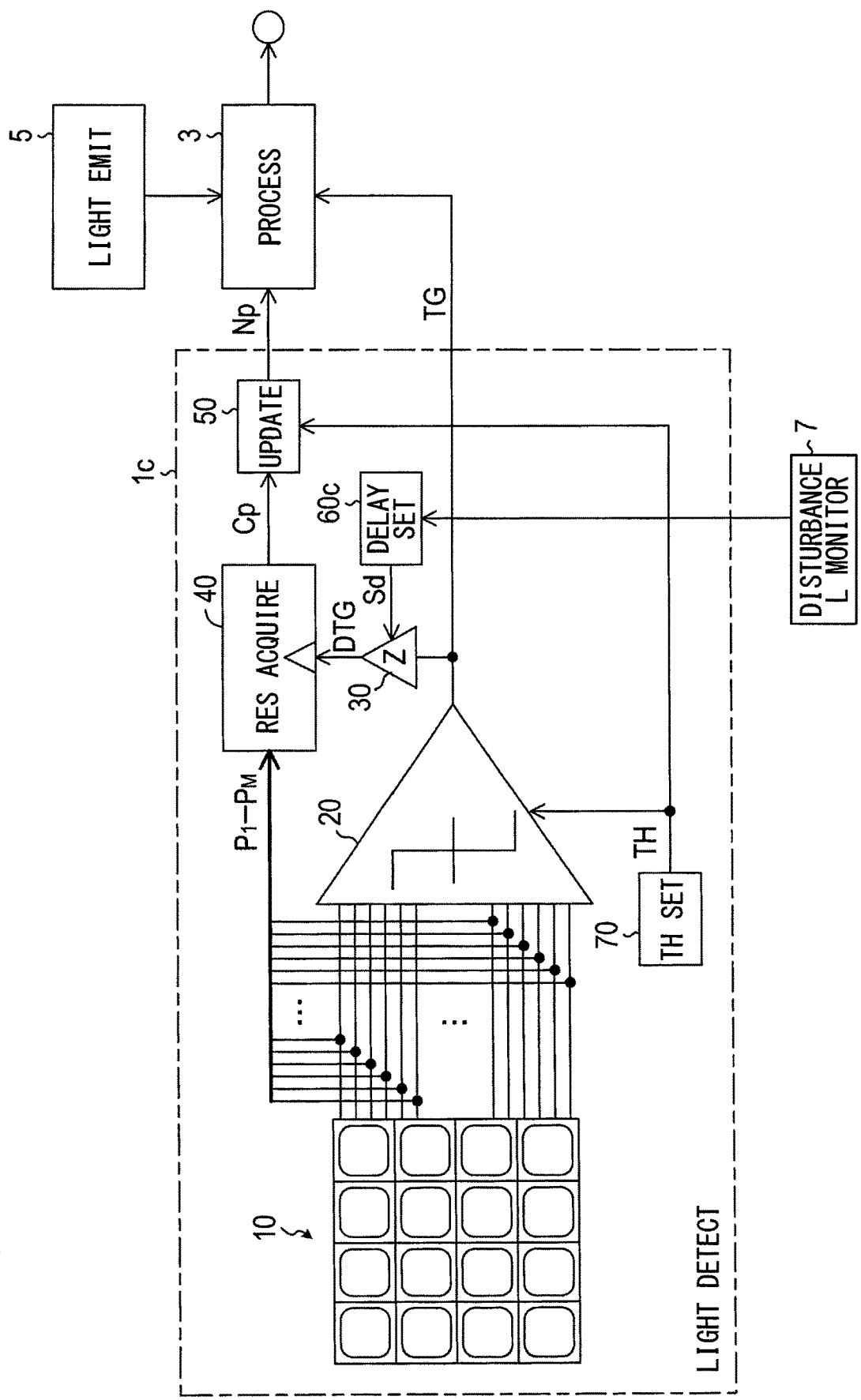
FIG. 9 is a block diagram showing a configuration of a light reception processing apparatus according to a fourth embodiment.

As shown in FIG. 9, in the light detector 1c of this embodiment, the delay setting module 60c acquires the disturbance light information from the disturbance light monitor 7, and variably sets the delay setting value Sd according to the acquired disturbance light information. When the measurement using the light detector 1c is not performed, or in parallel with the measurement using the light detector 1c, the disturbance light monitor 7 repeatedly measures the intensity of disturbance light incident on the light receiving array 10 and outputs the average value of the measurement results as disturbance light information. The disturbance light information is one of the intensity interlocking information (i.e., one of the intensity interlocking data-items). Specifically, the delay setting module 60c uses the disturbance light information instead of the object information, and generates the delay setting value Sd using the same method as the delay setting module 60b in the third embodiment.

[4-2. Effects]

According to the fourth embodiment described above, the effect (1a) of the first embodiment described above is exhibited, and further, the following effect is exhibited.

(4a) According to the light detector 1c, even if the intensity of the disturbance light incident on the light receiving array 10 changes every moment, the delay amount of the delayed trigger signal DTG is appropriately set so as to follow the intensity of the disturbance light changing every moment.

5. Fifth Embodiment

[5-1. Main Difference from First Embodiment]

Since the basic configuration of a fifth embodiment is similar to the fourth embodiment, the main difference will be described below. Note that the same reference signs as those in the first embodiment indicate the same configuration, and refer to the preceding descriptions.

In the fourth embodiment described above, the delay setting value Sd is generated according to the disturbance light information. In contrast, the fifth embodiment is different from the fourth embodiment in that the trigger threshold value TH is generated according to the disturbance light information.

Figure 10:
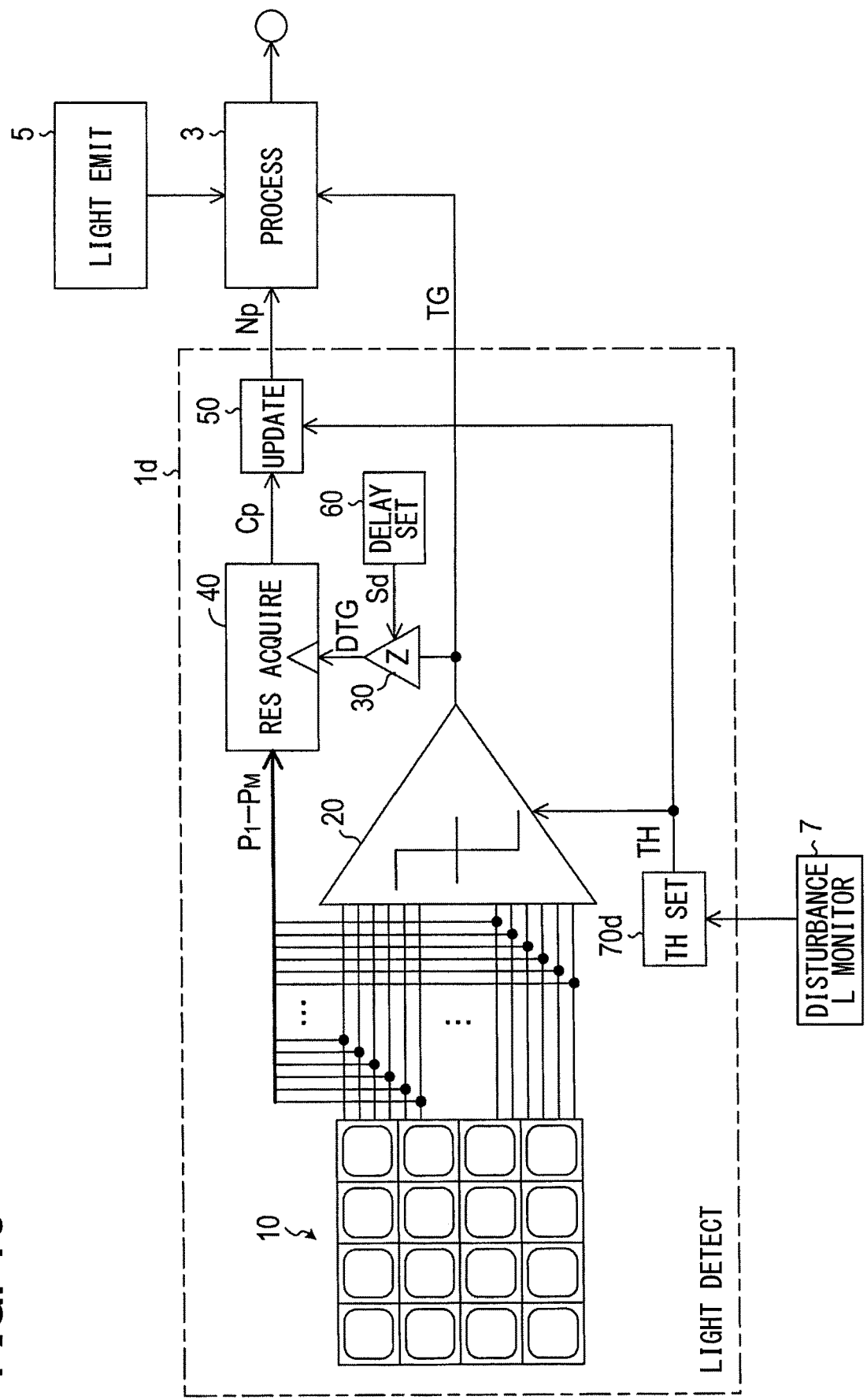
FIG. 10 is a block diagram showing a configuration of a light reception processing apparatus according to a fifth embodiment.

As shown in FIG. 10, in the light detector 1d of this embodiment, the threshold value setting module 70d acquires the disturbance light information from the disturbance light monitor 7, and variably sets the trigger threshold value TH according to the acquired disturbance light information. Specifically, a table representing the correspondence between the disturbance light information and the trigger threshold value TH is used. The table may be stored in a storage. The table is set so that the trigger threshold value TH becomes larger as the intensity of the disturbance light indicated by the disturbance light information becomes larger based on the experiment result and the like. Then, when the disturbance light information is generated by the disturbance light monitor 7, the threshold value setting module 70d automatically generates a trigger threshold value TH suitable for the intensity of disturbance light using the above table stored in the storage. The operations of the comparison module 20 and the update module 50 change according to the trigger threshold value TH.

Here, the configuration in which the trigger threshold value TH is variably set according to the disturbance light information is applied to the configuration of the first embodiment, but is not limited to this, and is applied to the configurations of the second to fourth embodiments.

[5-2. Effects]

According to the fifth embodiment described above, the effect (1a) of the first embodiment described above is exhibited, and further, the following effect is exhibited.

(5a) According to the light detector 1d, the trigger threshold value TH suitable for the intensity of disturbance light is automatically set, so that the adjustment process can be simplified.

(5b) According to the light detector 1d, even if the intensity of the disturbance light incident on the light receiving array 10 changes every moment, the trigger threshold value TH is set appropriately so as to follow the intensity of the disturbance light changing every moment.

6. Sixth Embodiment

[6-1. Main Differences from First Embodiment]

Since the basic configuration of a sixth embodiment is similar to the first embodiment, the main difference will be described below. Note that the same reference signs as those in the first embodiment indicate the same configuration, and refer to the preceding descriptions.

The sixth embodiment is different from the first embodiment in that not only the trigger threshold value TH and the delay amount of the delayed trigger signal DTG but also the pulse widths of the pulse signals $P_1$ to $P_M$ input to the response acquisition module 40 are variably set.

Figure 11:
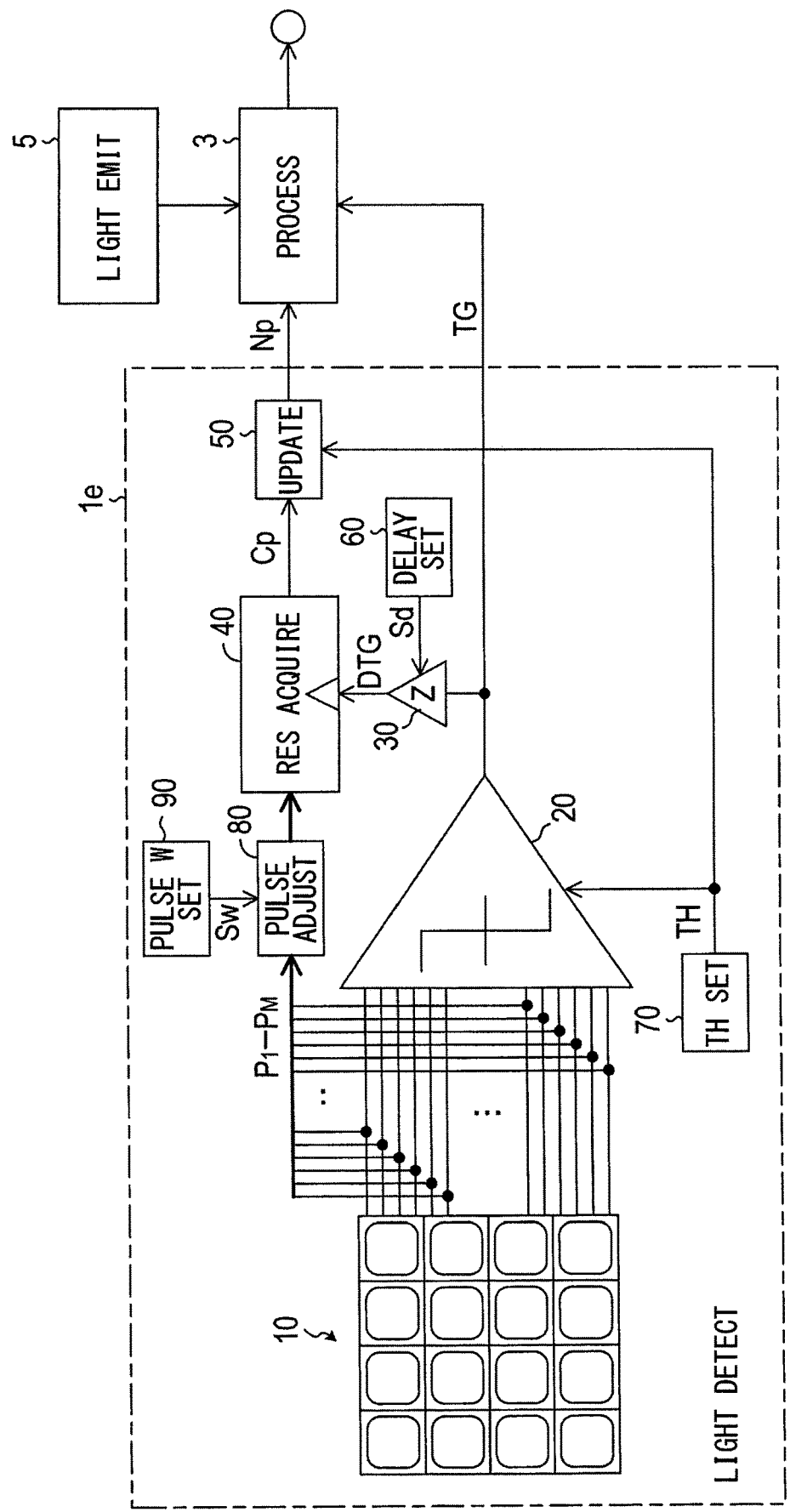
FIG. 11 is a block diagram showing a configuration of a light reception processing apparatus according to a sixth embodiment.

As shown in FIG. 11, the light detector 1e of this embodiment includes a pulse adjustment module 80 and a pulse width setting module 90 in addition to the configuration of the light detector 1 of the first embodiment. The output of the light receiving array 10 is branched into two branch paths; a first branch path is connected with the comparison module 20, and a second branch path is connected with the response acquisition module 40. The pulse adjustment module 80 is inserted into the second branch path connected to the response acquisition module 40. The pulse adjustment module 80 includes M adjustment circuits 81 corresponding to the respective M light receivers 11 included in the light receiving array 10.

Figure 12:
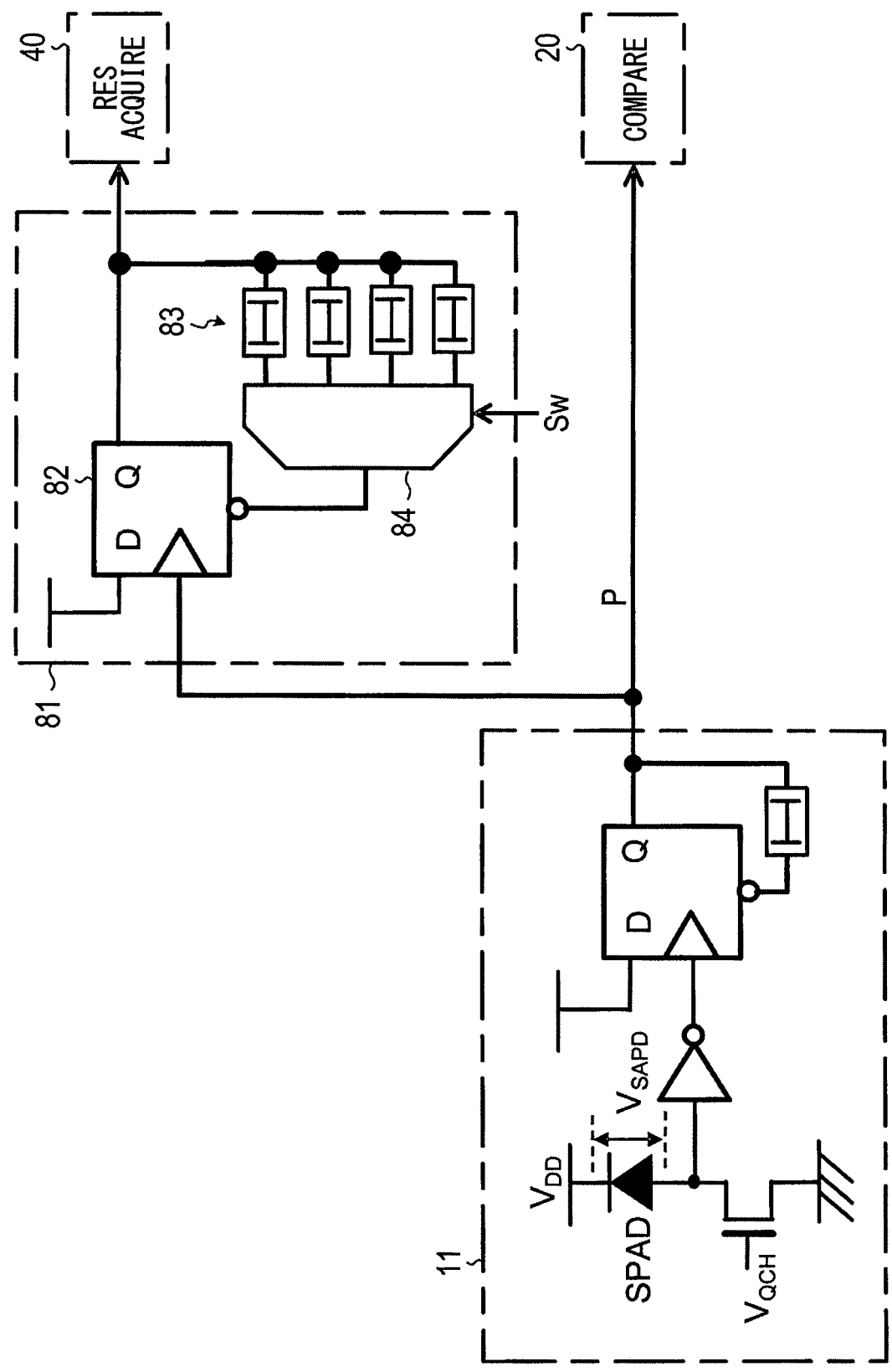
FIG. 12 is a circuit diagram showing a configuration of a pulse width setting module according to the sixth embodiment.

The adjustment circuit 81 includes a DFF circuit 82, a delay circuit group 83, and a selector 84, as shown in FIG. 12. The DFF circuit 82 changes its output from the low level to the high level at the time when the output of the light receiver 11 changes from the low level to the high level, that is, at time when the pulse signal P is generated. The delay circuit group 83 includes a plurality of delay circuits each having a different delay amount. The selector 84 selects any one of the delay circuits according to the width setting value Sw output from the pulse width setting module 90, inverts the signal level of the output of the selected delay circuit, and inputs the inverted signal level to the reset terminal of the DFF circuit 82. As a result, the output of the DFF circuit 82 changes to the low level by resetting the DFF circuit 133 when the delay time in the selected delay circuit elapses after changing to the high level. That is, the adjustment circuit 81 converts the pulse width of the input pulse signal P into a pulse width determined by the selected delay circuit and outputs it.

The pulse width setting module 90 includes (i) a mechanical switch capable of setting the width setting value Sw or (ii) a register capable of electrically writing the width setting value Sw.

In the present embodiment, the pulse width setting module 90 is configured to set the width setting value Sw manually, but in the same manner as the delay setting modules 60a to 60c described in the other embodiments, it may be configured to be set automatically based on the trigger threshold value TH and the intensity interlocking information.

[6-2. Effects]

According to the sixth embodiment described above, the effect (1a) of the first embodiment described above is exhibited, and further, the following effect is exhibited.

(6a) The light detector 1e includes the pulse width setting module 90, and is configured to be able to appropriately adjust the pulse widths of the pulse signals $P_1$ to $P_M$ input to the response acquisition module 40. Therefore, according to the light detector 1e, the response number in the light receiving array 10 can be acquired at more accurate time.

7. Other Embodiments

While the embodiments of the present disclosure have been described above, the present disclosure is not limited to the embodiments described above and can be carried out with various modifications.

Figure 13:
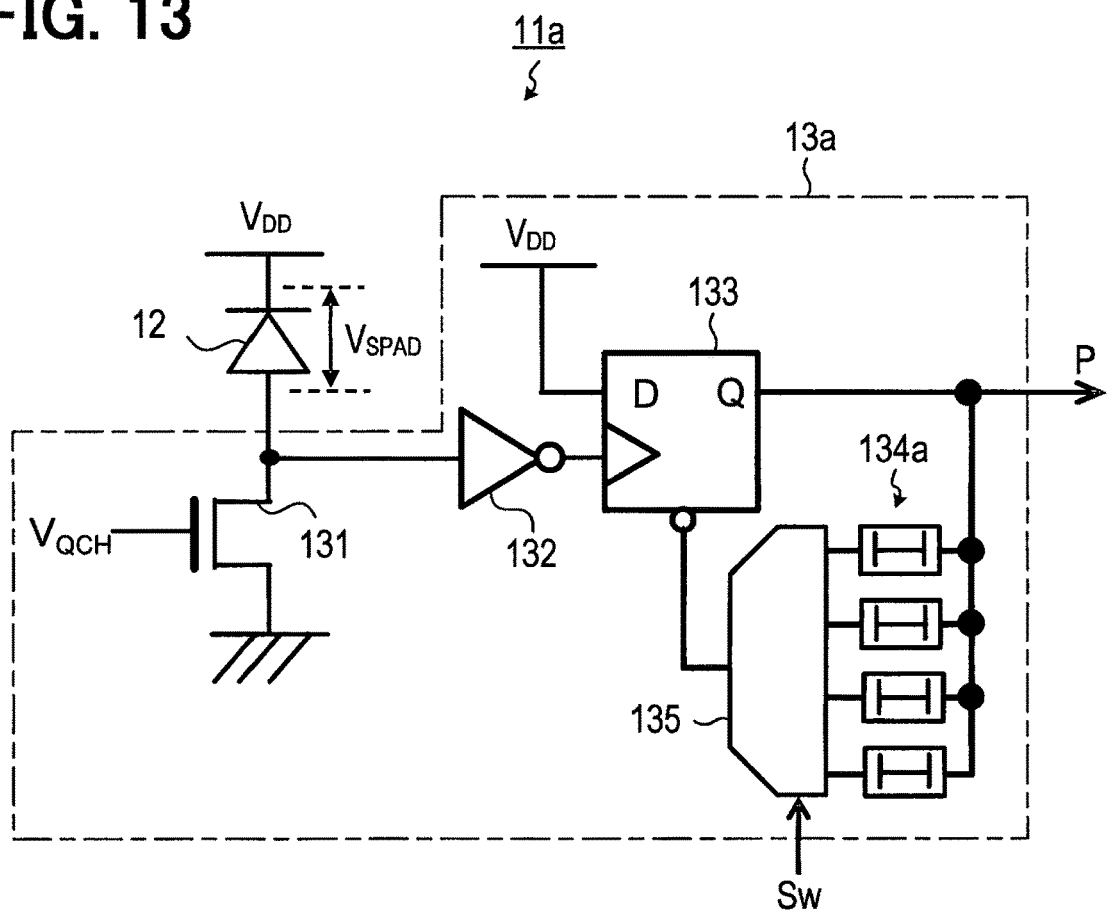
FIG. 13 is a circuit diagram showing a configuration of an SPAD having a function of a pulse width setting module.

(7a) In the sixth embodiment, the pulse width of the pulse signals $P_1$ to $P_M$ input to the response acquisition module 40 is adjusted, but the pulse signals $P_1$ to $P_M$ input to the comparison module 20 may be configured to adjust the pulse width. This may be referred to as a first modification example. The first modification example may be configured by modifying the sixth embodiment as follows: (i) the pulse adjustment module 80 in the light detector 1e of the sixth embodiment in FIG. 11 is omitted, and (ii) the light reception circuit 13 of the light receiver 11 is replaced with the light reception circuit 13a of the light receiver 11a shown in FIG. 13. The light reception circuit 13a is configured by modifying as follows: (i) the delay circuit 134 in the light reception circuit 13 in FIG. 2 is replaced with a delay circuit group 134a and a selector 135 configured similarly to the delay circuit group 83 and the selector 84 of the pulse adjustment module 80 according to the sixth embodiment in FIG. 11.

Figure 14:
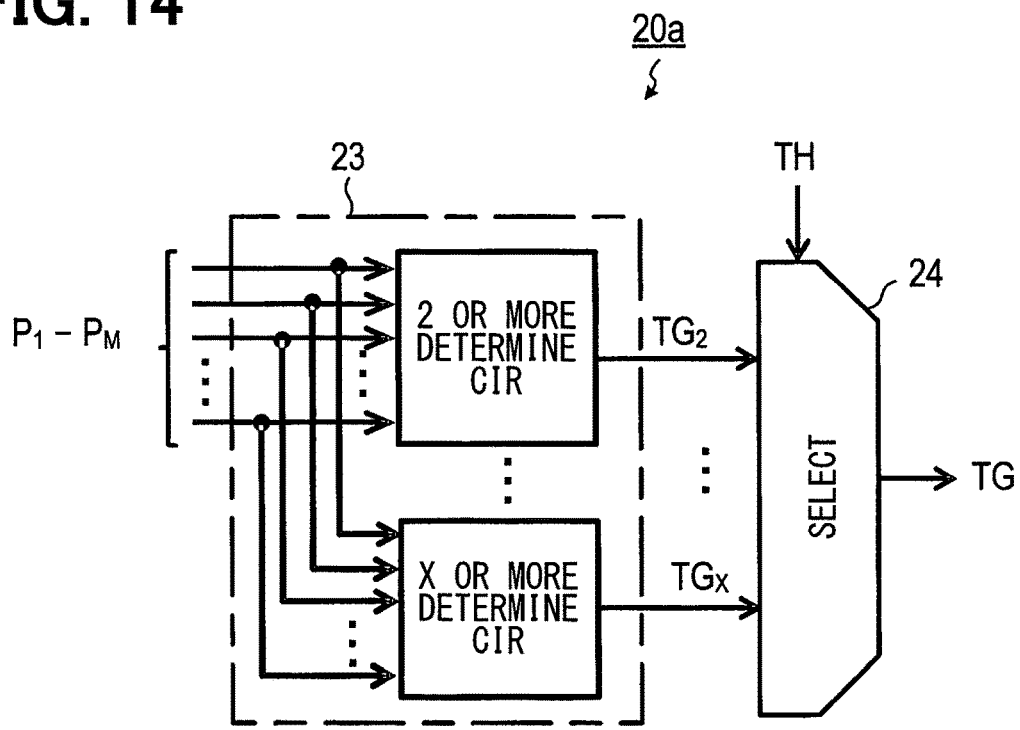
FIG. 14 is a circuit diagram showing another configuration example of a comparison module.

(7b) In the above embodiments, the comparison module 20 is configured using the encoder 21 and the comparator 22, but, this may be replaced with the comparison module 20a shown in FIG. 14. This may be referred to as a second modification example. The comparison module 20a includes a determination circuit group 23 and a selector 24. The determination circuit group 23 includes X−1 determination circuits, which have X−1 selectable trigger threshold values TH. X is an integer of 2 or more and M or less. Each determination circuit counts the number of pulse signals simultaneously output from the light receiving array 10, and outputs an individual trigger signal $TG_x$ when the count value is x or more. Here, x is an integer of 2 or more and X or less, and is set to a different value for each determination circuit. The selector 24 outputs the output of the determination circuit with TH=x, as the trigger signal TG, according to the trigger threshold value TH. In this case, the delay required for generating the trigger signal TG can be equalized regardless of the value of the trigger threshold value TH. In this case, the delay in the comparison module 20a can be made constant.

Figure 17:
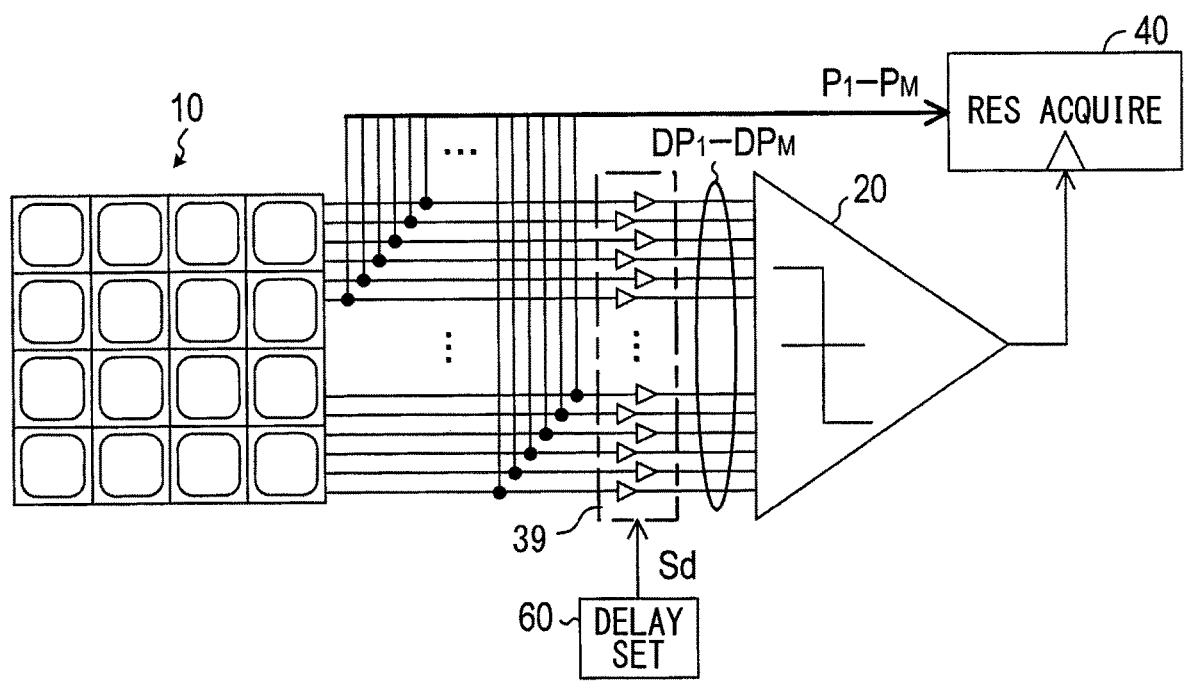
FIG. 17 is a circuit diagram showing a modification of a delay module.

(7c) Although the delay module 30 that delays the trigger signal TG and outputs the delayed trigger signal DTG is provided in the above embodiments, the present disclosure is not limited to this. This may be referred to as a third modification example. As shown in FIG. 17, instead of the delay module 30, or in addition to the delay module 30, a delay module 39 may be provided. The delay module 39 delays the pulse signals $P_1$ to $P_M$ output from the light receiving array 10 and outputs the delayed pulse signals $DDP_1$ to $DP_M$. In this case, the delay setting module 60 may be configured to be able to set the delay of the delay module 39 as needed. Further, instead of the delay setting module 60, the delay setting modules 60a to 60c may be used. In addition, the comparison module 20 may be configured to generate the trigger signal TG according to the delayed pulse signals $DP_1$ to $DP_M$. With these configurations, it is possible to obtain the same effect as controlling the delay of the delayed trigger signal DTG.

(7d) A plurality of functions of one element in the above embodiments may be implemented by a plurality of elements, or one function of one element may be implemented by a plurality of elements. Further, a plurality of functions of a plurality of elements may be implemented by one element, or one function implemented by a plurality of elements may be implemented by one element. A part of the configuration of above each embodiment may be omitted. At least a part of the configuration of above each embodiment may be added to or replaced with another configuration of above each embodiment.

(7e) The present disclosure can be realized, in addition to the light detectors 1 and 1a to 1e described above, in various forms such as a system including the light detectors 1 and 1a to 1e as elements.

For reference to further explain features of the present disclosure, the description is added as follows. A related art describes a light detector that uses an SPAD array in which a plurality of SPADs are arrayed, counts the number of pulse signals output from each SPAD onto which photons are incident, and thereby detects a light reception intensity. Here, SPAD, which is an abbreviation of Single Photon Avalanche Diode, is an avalanche photodiode that operates in Geiger mode and can detect the incidence of a single photon.

In the above-described light detector, when the number of pulse signals exceeds a predetermined trigger threshold value, a trigger signal represent the light reception time is generated; then a delayed trigger signal is output at a delayed trigger signal time with a delay from the light reception time. The number of the pulse signals output simultaneously at the delayed trigger signal time is detected as a data representing the light reception intensity.

However, as a result of the inventor's detailed examination, the number of pulse signals was found to be different from the detection result depending on the output time of the delayed trigger signal. That is, the pulse signals output from the individual SPADs are not necessarily generated at the same time, and the generation pattern changes in various ways depending on various situations.

It is thus desired to provide a technique for improving detection accuracy of the light reception intensity in an SPAD array.

An embodiment of the present disclosure described herein is set forth in the following clauses.

According to an embodiment of the present disclosure, a light detector is provided to include a light receiving array, a comparison module, a response acquisition module, and a delay setting module.

The light receiving array includes a plurality of light receivers respectively outputting pulse signals upon incidence of photons. The light receiving array is capable of outputting in parallel the pulse signals respectively output from the plurality of light receivers. The comparison module, which may be connected with the light receiving array, compares a response number, which is a specified number of the light receivers outputting the pulse signals, with a trigger threshold value, and outputs a trigger signal representing a light reception time of a light signal incident on the light receiving array at a time when the response number reaches the trigger threshold value. The response acquisition module, which may be connected with the light receiving array, acquires the response number at a time according to the trigger signal and output the acquired response number as intensity information representing an intensity of the light signal. The delay setting module sets a delay setting value used to adjust a time interval from when the pulse signals are output from the light receiving array to when the response acquisition module acquires the response number.

According to such a configuration, the time when the response acquisition module acquires the response number can be changed depending on situations. Then, the time of acquiring the response number is set appropriately as to maximize the response number. The detection accuracy of the response number can thus be improved.

What is claimed is:

1. A light detector comprising:
   a light receiving array including a plurality of light receivers respectively outputting pulse signals upon incidence of photons, the light receiving array being capable of outputting in parallel the pulse signals respectively output from the plurality of light receivers;
   a comparison module configured to
      compare a response number, which is a specified number of the light receivers outputting the pulse signals, with a trigger threshold value, and
      output a trigger signal representing a light reception time of a light signal incident on the light receiving array at a time when the response number reaches the trigger threshold value;
   a response acquisition module configured to
      acquire the response number at a time according to the trigger signal and
      output the acquired response number as intensity information representing an intensity of the light signal; and
   a delay setting module configured to set a delay setting value used to adjust a time interval from when the pulse signals are output from the light receiving array to when the response acquisition module acquires the response number.

2. The light detector according to claim 1, further comprising:
   a delay module configured to add a delay amount to the trigger signal output from the comparison module to generate a delayed trigger signal,
   wherein:
   the delay setting module is configured to use, as the delay setting value, the delay amount added to the trigger signal by the delay module to generate the delayed trigger signal; and
   the response acquisition module is configured to acquire the response number at a time according to the delayed trigger signal.

3. The light detector according to claim 1, further comprising:
   a delay module configured to add a delay amount to the pulse signal output from the light receiving array to generate a delayed pulse signal,
   wherein:
   the delay setting module is configured to use, as the delay setting value, the delay amount added to the pulse signal by the delay module to generate the delayed pulse signal; and
   the comparison module is configured to output the trigger signal according to the delayed pulse signal.

4. The light detector according to claim 2, wherein the delay setting module is configured to set the delay setting value according to intensity interlocking information interlocked with the intensity of the light signal.

5. The light detector according to claim 4, wherein the delay setting module is configured to set the delay setting value larger as an intensity represented by the intensity interlocking information is higher.

6. The light detector according to claim 2, further comprising:
   a threshold value setting module configured to variably set the trigger threshold value used in the comparison module.

7. The light detector according to claim 6, wherein the delay setting module is configured to set the delay setting value according to the trigger threshold value set by the threshold value setting module.

8. The light detector according to claim 7, wherein the delay setting module is configured to set the delay setting value larger as the trigger threshold value is smaller.

9. The light detector according to claim 2, further comprising:
a pulse adjustment module configured to adjust a pulse width of the pulse signal input to the response acquisition module; and
a pulse width setting module configured to variably set the pulse width adjusted by the pulse adjustment module.

10. The light detector according to claim 9, wherein the pulse width setting module is configured to variably set the pulse width according to intensity interlocking information interlocked with the intensity of the light signal.

11. The light detector according to claim 9, further comprising:
a threshold value setting module configured to variably set the trigger threshold value used in the comparison module.

12. The light detector according to claim 11, wherein the pulse width setting module is configured to set the pulse width according to the trigger threshold value set by the threshold value setting module.

13. The light detector according to claim 12, wherein the pulse width setting module is configured to set the pulse width wider as the trigger threshold value is larger.

14. The light detector according to claim 6, wherein the threshold value setting module is configured to set the trigger threshold value according to intensity interlocking information interlocked with the intensity of the light signal.

15. The light detector according to claim 14, wherein the threshold value setting module is configured to set the trigger threshold value larger as an intensity represented by the intensity interlocking information is higher.

16. The light detector according to claim 4, wherein:
as the intensity interlocking information, (i) a distance to an object, or (ii) the intensity of the light signal, or (iii) both the distance to the object and the intensity of the light signal are used, wherein the distance to the object and the intensity of the light signal are acquired from a past measurement cycle and acquired from a processor that processes the trigger signal and the intensity information; and
when the distance to the object is used as the intensity interlocking information, the intensity is considered to be higher as the distance to the object is shorter.

17. The light detector according to claim 4, wherein the intensity interlocking information includes a measurement result acquired from a monitor that measures an intensity of a disturbance light incident on the light receiving array.

18. The light detector according to claim 1, wherein:
the comparison module includes two or more trigger threshold values, and is configured to output the trigger signals for the respective trigger threshold values; and
the comparison module includes a trigger selection module configured to switch the trigger signals to select the trigger signal used to acquire the response number in the response acquisition module according to the trigger threshold value.

19. The light detector according to claim 1, further comprising:
an update module configured to update the intensity information to the trigger threshold value in response to that the intensity information output from the response acquiring module is smaller than the trigger threshold value used in the comparison module.

20. The light detector according to claim 1, wherein the response number is the number of the light receivers that are simultaneously outputting the respective pulse signals.

21. A light detector comprising:
a light receiving array including a plurality of light receivers respectively outputting pulse signals upon incidence of photons, the light receiving array being capable of outputting in parallel the pulse signals respectively output from the plurality of light receivers;
a comparison module connected with the light receiving array and configured to compare a response number, which is a specified number of light receivers outputting the pulse signals, with a trigger threshold value, and output a trigger signal representing a light reception time of a light signal incident on the light receiving array at a time when the response number reaches the trigger threshold value;
a response acquisition module connected with the light receiving array and the comparison module and configured to acquire the response number at a time according to the trigger signal and output the acquired response number as intensity information representing an intensity of the light signal; and
a delay setting module configured to set a delay setting value used to adjust a time interval from when the pulse signals are output from the light receiving array to when the response acquisition module acquires the response number.

* * * * *